US006328795B2

(12) United States Patent
Falster et al.

(10) Patent No.: US 6,328,795 B2
(45) Date of Patent: *Dec. 11, 2001

(54) PROCESS FOR GROWTH OF DEFECT FREE SILICON CRYSTALS OF ARBITRARILY LARGE DIAMETERS

(75) Inventors: Robert J. Falster, Milan (IT); Harold W. Korb, Town & Country, MO (US)

(73) Assignee: MEMC Electronic Materials, Inc., St. Peters, MO (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/344,709

(22) Filed: Jun. 25, 1999

Related U.S. Application Data

(60) Provisional application No. 60/117,623, filed on Jan. 28, 1999, provisional application No. 60/104,087, filed on Oct. 14, 1998, and provisional application No. 60/090,723, filed on Jun. 26, 1998.

(51) Int. Cl.$^7$ .................................................. C30B 15/00

(52) U.S. Cl. .................................. 117/13; 117/15; 117/35

(58) Field of Search ...................... 117/3, 13, 15, 117/932, 35, 208, 215, 218, 906

(56) References Cited

U.S. PATENT DOCUMENTS

| 4,314,595 | 2/1982 | Yamamoto et al. .................. 148/1.5 |
| 4,350,560 | * 9/1982 | Helgeland et al. ..................... 117/35 |
| 4,981,549 | 1/1991 | Yamashita et al. ............... 156/620.4 |
| 5,264,189 | 11/1993 | Yamashita et al. .................. 422/249 |
| 5,474,020 | 12/1995 | Bell et al. ............................ 117/20 |
| 5,485,803 | 1/1996 | Habu ..................................... 117/14 |

(List continued on next page.)

FOREIGN PATENT DOCUMENTS

| 39 05 626 A1 | 8/1989 | (DE) . |
| 43 23 964 A1 | 1/1994 | (DE) . |
| 44 14 947 A1 | 8/1995 | (DE) . |
| 198 06 045 A1 | 8/1998 | (DE) . |
| Hei 2-180789 | 7/1990 | (EP) .............................. C30B/15/20 |
| Hei 3-093700 | 4/1991 | (EP) .............................. C30B/33/02 |

(List continued on next page.)

OTHER PUBLICATIONS von Ammon, W., et al. "Bulk properties of very large diameter silicon single crystals" Journal of Crystal Growth, vol. 198/199, pp. 390–398 (1999).

Hourai, M., et al."Growth Parameters Determining the Type of Grown–In Defects in Czockralski Silicon Crystals", Materials Science Forum, vols. 196–201 (1995) pp. 1713–1718.

Park, J. G., et al., "Effect of Crystal Defects on Device Characteristics", Proceedings of the Symposium on Crystalline Defects and Contamination: Their Impact And Control In Device Manufacturing II, Proceed. vol. 97–22 (1997), pp. 173–195.

Puzanov, N., et al., "Formation of the bands of anomalous oxygen precipitation in Czochralski–grown Si crystals" Journal of Crystal Growth, vol. 137, pp. 642–652 (1994).

(List continued on next page.)

*Primary Examiner*—Robert Kunemund
*Assistant Examiner*—Binh X. Tran
(74) *Attorney, Agent, or Firm*—Senniger, Powers, Leavitt & Roedel (57) ABSTRACT

A process for growing single crystal silicon ingots which are substantially free of agglomerated intrinsic point defects. An ingot is grown generally in accordance with the Czochralski method. No portion of the ingot cools to a temperature which is less than a temperature $T_A$ at which agglomeration of intrinsic point defects in the ingot occurs during the time the ingot is being grown. The achievement of defect free ingots is thus substantially decoupled from process parameters, such as pull rate, and system parameters, such as axial temperature gradient in the ingot.

31 Claims, 6 Drawing Sheets

U.S. PATENT DOCUMENTS

| | | |
|---|---|---|
| 5,487,354 | 1/1996 | von Ammon et al. ............... 117/13 |
| 5,667,584 | 9/1997 | Takano et al. .......................... 117/13 |
| 5,704,973 | 1/1998 | Sakurada et al. ...................... 117/15 |
| 5,728,211 | 3/1998 | Takano et al. .......................... 117/14 |
| 5,919,302 * | 7/1999 | Falster et al. ............................ 117/3 |
| 5,954,873 * | 9/1999 | Hourai et al. .......................... 117/13 |
| 5,958,133 * | 9/1999 | Boulaev ............................... 117/208 |
| 5,968,262 | 10/1999 | Saishouji et al. ...................... 117/13 |
| 5,968,264 | 10/1999 | Iida et al. ............................... 117/30 |
| 6,045,610 | 4/2000 | Park et al. ............................. 117/13 |
| 6,153,008 | 11/2000 | Von Ammon et al. |

FOREIGN PATENT DOCUMENTS

| | | | |
|---|---|---|---|
| 0 503 816 B1 | 3/1992 | (EP) . | |
| 0 504 837 A2 | 3/1992 | (EP) . | |
| Hei 4-108682 | 4/1992 | (EP) ............................. | C30B/15/00 |
| 0 536 958 A1 | 10/1992 | (EP) . | |
| 0 716 168 A1 | 11/1995 | (EP) . | |
| 0747513 A2 | 12/1996 | (EP) . | |
| 0 799 913 A1 | 10/1997 | (EP) ............................. | C30B/15/00 |
| 0866150 | 9/1998 | (EP) . | |
| 0 962 556 A1 | 8/1999 | (EP) ............................. | C30B/15/00 |
| 0962555 | 12/1999 | (EP) . | |
| 0962557A1 | 12/1999 | (EP) . | |
| 2 182 262 A | 5/1987 | (GB) . | |
| HO 8-268794 Hei | 3/1995 | (JP) . | |
| 07-158458 | 5/1995 | (JP) . | |
| HO 9-202690 | 1/1996 | (JP) . | |
| 11-157995-A | 6/1999 | (JP) ............................. | C30B/29/06 |
| 11-180800-A | 7/1999 | (JP) ............................. | C30B/29/06 |
| 11-189495-A | 7/1999 | (JP) ............................. | C30B/29/06 |
| 11-199386-A | 7/1999 | (JP) ............................. | C30B/29/06 |
| 11-199387-A | 7/1999 | (JP) ............................. | C30B/29/06 |
| WO 97/26393 | 1/1996 | (WO) . | |
| WO 98/45507 | 10/1998 | (WO) ........................... | C30B/15/00 |
| WO 98/45508 | 10/1998 | (WO) ........................... | C30B/15/00 |
| WO 98/45509 | 10/1998 | (WO) . | |
| WO 98/45510 | 10/1998 | (WO) ........................... | C30B/15/00 |

OTHER PUBLICATIONS

Puzanov, N., et al., "The Role of Intrinsic Point Defects in the Formation of Oxygen Precipitation Centers in Dislocation–Free Silicon" Crystallography Reports, vol. 41, No. 1, pp. 134–141 (1996).

Puzanov, N.L., et al., "Harmful Microdefects in the Seed–End Portion of Large–Diameter Silicon Ingots", Inorganic Materials, vol. 33, No. 8, pp. 765–769 (1997).

Puzanov, N., et al., "Modelling microdefect distribution in dislocation–free Si crystals grown from the melt", Journal of Crystal Growth, vol. 178, pp. 468–478 (1997).

Puzanov, N., et al., "Role of Vacancies in the Nucleation of Ringlike–patterned Oxidation–induced Stacking Faults in Melt–grown Silicon Crystals" Inorganic Materials, vol. 34–4, pp. 307–314 (1998).

Roksnoer, P. J., "Microdefects in a Non–Striated Distribution in Floating–Zone Silicon Crystals", Journal of Crystal Growth, vol. 53 (1981), pp. 563–573.

Roksnoer, P. J., "The Mechanism of Formation of Micro-defects in Silicon", Journal of Crystal Growth, vol. 68 (1984), pp. 596–612.

A. J. R. De Kock et al.; "The Effect Of Doping On The Formation Of Swirl Defects In Dislocation–Free Czochralski–Grown Silicon Crystals"; *Journal of Crystal Growth*, 1980; vol. 49; pp. 718–734.

A. M. Eidenzon et al.; "Defect–Free Silicon Crystals Grown By The Czochralski Technique"; *Inorganic Materials*; 1997; vol. 33, No. 3, pp. 219–225.

A. M. Eidenzon et al.; "Influence Of growth Rate On Swirl Defects In Large Dislocation–Free Crystals Of Silicon Grown By The Czochralski Method"; 1985; *Sov. Phys. Crystallogr.*; vol. 30; No. 5; pp. 576–580.

N. I. Puzanov et al.; "Relaxation In A System Of Point Defects In A Growing Dislocation–Free Crystal Of Silicon"; 1986; *Sov. Phys. Crystallogr.*; vol. 31; No. 2; pp. 219–222.

Dornberger, E., et al., "Simulation of Grown–In Voids in Czochralski Silicon Crystals", Electrochemical Society Proceedings, vol. 97, No. 22, pp. 40–49 (1997).

Dornberger, E., et al., "Simulation of Non–Uniform Grow–In Void Distributions in Czochralski Silicon Crystals", Electrochemical Society Proceedings, vol. 98, vol. 1, pp. 490–503 (1998).

Dornberger, E., et al., "The Impact of Dwell Time Above 900°C. During Crystal Growth on the Gate Oxide Integrity of Silicon Wafers", Electrochemical Society Proceedings, vol. 96, No. 13, pp. 140–151 (1996).

Nakamura, Kozo, et al., "Formation Process of Grown–In Defects in Czochralski Grown Silicon Crystals", Journal of Crystal Growth, vol. 180, pp. 61–72, 1997.

Sinno, T., et al., "On the Dynamics of the Oxidation–Induced Stacking–Fault Ring in as–grown Czochralski silicon crystals", Applied Physics Letters, vol. 70, No. 17, pp. 2250–2252, 1997.

Sinno, T., et al., "Point Defect Dynamics and the Oxidation–Induced Stacking–Fault Ring in Czochralski–Grown Silicon Crystals", J. Electrochem. Soc., vol. 145, No. 1, pp. 302–318, 1998.

Tan, T. Y., "Point Defects, Diffusion Processes, and Swirl Defect Formation in Silicon", Appl. Phys. A., vol. 37, pp. 1–17, 1985.

Vanhellemont, J., et al., "Defects in As–Grown Silicon and Their Evolution During Heat Treatments", Materials Science Forum, vols. 258–263, pp. 341–346, 1997.

A. J. R. de Kock, et al., "The Effect of Doping on the Formation of Swirl Defects in Dislocation–Free Czochralski–Grown Silicon Crystals", Journal of Crystal Growth, vol. 49, pp. 718–734 (1980).

G. Kissinger, et al. "A Method for Studying the Grown–In Defect Density Spectra in Czochralski Silicon Wafers" Journal of Electrochemical Society, vol. 144, No. 4 (1997), pp. 1447–1456.

E. Dornberger et al., "The Dependence of Ring Like Distributed Stacking Faults on the Axial Temperature Gradient of Growing Czochralski Silicon Crystals" Electrochemical Society Proceedings, vol. 95–4, (May 1995) pp. 294–305.

von Ammon et al. "The Dependence of bulk defects on the axial temperature gradient of silicon crystals during Czochralski growth" Journal of Crystal Growth, vol. 151 (1995) pp. 273–277.

V. Voronkov et al., "Behaviour and Effects of Intrinsic Point Defects in the Growth of Large Silicon Crystals" Electrochemical Society proceedings, vol. 97–22, (Aug. 1997), pp. 3–17.

Voronkov, "The Mechanism of Swirl Defects Formation in Silicon", Journal of crystal growth vol. 59 pp. 625–643.

R. Winkler et al. "Improvement of the Gate Oxide Integrity by Modifying Crystal Pulling and Its Impact on Device Failures" Journal of the Electrochemical Society, vol. 141, No. 5 (May 1994) pp. 1398–1401.

H. Zimmerman et al. "Vacancy concentration wafer mapping in silicon" Journal of Crystal Growth, vol. 129, (1993), pp. 582–592.

* cited by examiner

PROCESS FOR GROWTH OF DEFECT FREE SILICON CRYSTALS OF ARBITRARILY LARGE DIAMETERS

CROSS-REFERENCE TO RELATED APPLICATION

This application claims priority from U.S. Provisional Application Serial No. 60/117,623 filed on Jan. 28, 1999, U.S. Provisional Application Serial No. 60/104,087 filed on Oct. 14, 1998 and U.S. Provisional Application Serial No. 60/090,723 filed on Jun. 26, 1998.

BACKGROUND OF THE INVENTION

The present invention generally relates to the preparation of semiconductor grade single crystal silicon which is used in the manufacture of electronic components. More particularly, the present invention relates to a process for producing a single crystal silicon ingot which is substantially devoid of agglomerated intrinsic point defects over the entire crystal radius and usable length of the ingots.

Single crystal silicon, which is the starting material for most processes for the fabrication of semiconductor electronic components, is commonly prepared by the so-called Czochralski ("Cz") method. In this method, polycrystalline silicon ("polysilicon") is charged to a crucible and melted, a seed crystal is brought into contact with the molten silicon and a single crystal is grown by slow extraction. After formation of a neck is complete, the diameter of the crystal is enlarged by decreasing the pulling rate and/or the melt temperature until the desired or target diameter is reached. The cylindrical main body of the crystal which has an approximately constant diameter is then grown by controlling the pull rate and the melt temperature while compensating for the decreasing melt level. Near the end of the growth process but before the crucible is emptied of molten silicon, the crystal diameter must be reduced gradually to form an end-cone. Typically, the end-cone is formed by increasing the crystal pull rate and heat supplied to the crucible. When the diameter becomes small enough, the crystal is then separated from the melt.

In recent years, it has been recognized that a number of defects in single crystal silicon form in the crystal growth chamber as the crystal cools after solidification. Such defects arise, in part, due to the presence of an excess (i.e., a concentration above the solubility limit) of intrinsic point defects in the crystal lattice, which are vacancies and self-interstitials. Silicon crystals grown from a melt are typically grown with an excess of one or the other type of intrinsic point defect, either crystal lattice vacancies ("V") or silicon self-interstitials ("I"). It has been suggested that the type and initial concentration of these point defects in the silicon are determined at the time of solidification and, if these concentrations reach a level of critical supersaturation in the system and the mobility of the point defects is sufficiently high, a reaction, or an agglomeration event, will likely occur. Agglomerated intrinsic point defects in silicon can severely impact the yield potential of the material in the production of complex and highly integrated circuits.

Vacancy-type defects are recognized to be the origin of such observable crystal defects as D-defects, Flow Pattern Defects (FPDs), Gate Oxide Integrity (GOI) Defects, Crystal Originated Particle (COP) Defects, crystal originated Light Point Defects (LPDs), as well as certain classes of bulk defects observed by infrared light scattering techniques such as Scanning Infrared Microscopy and Laser Scanning Tomography. Also present in regions of excess vacancies are defects which act as the nuclei for ring oxidation induced stacking faults (OISF). It is speculated that this particular defect is a high temperature nucleated oxygen agglomerate catalyzed by the presence of excess vacancies.

Defects relating to self-interstitials are less well studied. They are generally regarded as being low densities of interstitial-type dislocation loops or networks. Such defects are not responsible for gate oxide integrity failures, an important wafer performance criterion, but they are widely recognized to be the cause of other types of device failures usually associated with current leakage problems.

The density of such vacancy and self-interstitial agglomerated defects in Czochralski silicon is conventionally within the range of about $1*10^3/cm^3$ to about $1*10^7/cm^3$. While these values are relatively low, agglomerated intrinsic point defects are of rapidly increasing importance to device manufacturers and, in fact, are now seen as yield-limiting factors in device fabrication processes.

To date, there generally exists three main approaches to dealing with the problem of agglomerated intrinsic point defects. The first approach includes methods which focus on crystal pulling techniques in order to reduce the number density of agglomerated intrinsic point defects in the ingot. This approach can be further subdivided into those methods having crystal pulling conditions which result in the formation of vacancy dominated material, and those methods having crystal pulling conditions which result in the formation of self-interstitial dominated material. For example, it has been suggested that the number density of agglomerated defects can be reduced by (i) controlling $v/G_0$ to grow a crystal in which crystal lattice vacancies are the dominant intrinsic point defect, and (ii) influencing the nucleation rate of the agglomerated defects by altering (generally, by slowing down) the cooling rate of the silicon ingot from about 1100° C. to about 1050° C. during the crystal pulling process. While this approach reduces the number density of agglomerated defects, it does not prevent their formation. As the requirements imposed by device manufacturers become more and more stringent, the presence of these defects will continue to become more of a problem.

Others have suggested reducing the pull rate, during the growth of the body of the crystal, to a value less than about 0.4 mm/minute. This suggestion, however, is also not satisfactory because such a slow pull rate leads to reduced throughput for each crystal puller. More importantly, such pull rates lead to the formation of single crystal silicon having a high concentration of self-interstitials. This high concentration, in turn, leads to the formation of agglomerated self-interstitial defects and all the resulting problems associated with such defects.

A second approach to dealing with the problem of agglomerated intrinsic point defects includes methods which focus on the dissolution or annihilation of agglomerated intrinsic point defects subsequent to their formation. Generally, this is achieved by using high temperature heat treatments of the silicon in wafer form. For example, Fusegawa et al. propose, in European Patent Application 503,816 A1, growing the silicon ingot at a growth rate in excess of 0.8 mm/minute, and heat treating the wafers which are sliced from the ingot at a temperature in the range of 1150° C. to 1280° C. to reduce the defect density in a thin region near the wafer surface. The specific treatment needed will vary depending upon the concentration and location of agglomerated intrinsic point defects in the wafer. Different wafers cut from a crystal which does not have a uniform axial concentration of such defects may require different postgrowth processing conditions. Furthermore, such wafer heat treatments are relatively costly, have the potential for introducing metallic impurities into the silicon wafers, and are not universally effective for all types of crystal-related defects.

A third approach to dealing with the problem of agglomerated intrinsic point defects is the epitaxial deposition of a thin crystalline layer of silicon on the surface of a single crystal silicon wafer. This process provides a single crystal silicon wafer having a surface which is substantially free of agglomerated intrinsic point defects. Epitaxial deposition, however, substantially increases the cost of the wafer.

In view of these developments, a need continues to exist for a method of single crystal silicon preparation which acts to prevent the formation of agglomerated intrinsic point defects by suppressing the agglomeration reactions which produce them. Rather than simply limiting the rate at which such defects form, or attempting to annihilate some of the defects after they have formed, a method which acts to suppress agglomeration reactions would yield a silicon substrate that is free or substantially free of agglomerated intrinsic point defects. Such a method would also afford single crystal silicon wafers having epi-like yield potential, in terms of the number of integrated circuits obtained per wafer, without having the high costs associated with an epitaxial process.

It is now recognized that silicon single crystal ingots can be grown which have virtually no defects produced by agglomeration of intrinsic point defects. (See, e.g., PCT/US98/07365 and PCT/US98/07304.) A primary mechanism for the suppression of agglomeration reactions is the radial out-diffusion of intrinsic point defects. If given sufficient time at crystal temperatures in excess of the temperature $T_A$ at which agglomeration reactions will occur, self-interstitials and vacancies will either combine and annihilate each other or diffuse to sinks on the surface of the ingot.

Silicon self-interstitials appear to be extremely mobile at temperatures near the solidification temperature of silicon, i.e., about 1410° C. This mobility, however, decreases as the temperature of the single crystal silicon ingot decreases. Generally, the diffusion rate of self-interstitials slows such a considerable degree that they ate essentially immobile for commercially practical time periods at temperatures less than about 700° C., and perhaps at temperatures as great as 800° C., 900° C., 1000° C., or even 1050° C.

It is to be noted in this regard that, although the temperature at which a self-interstitial agglomeration reaction occurs may in theory vary over a wide range of temperatures, as a practical matter this range appears to be relatively narrow for conventional, Czochralski-grown silicon. This is a consequence of the relatively narrow range of initial self-interstitial concentrations which are typically obtained in silicon grown according to the Czochralski method. In general, therefore, a self-interstitial agglomeration reaction may occur, if at all, at temperatures ($T_A$) within the range of about 1100° C. to about 800° C., and typically at a temperature of about 1050° C.

By controlling the cooling rate of the ingot within a range of temperatures in which self-interstitials appear to be mobile, the self-interstitials may be given more time to diffuse to sinks located at the crystal surface, or to vacancy dominated regions, where they may be annihilated. The concentration of such interstitials may therefore be suppressed to a level low enough so that supersaturation of self-interstitials (i.e., a concentration above the solubility limit) does not occur at a temperature at which the self-interstitials are sufficiently mobile to agglomerate. The same principles apply for silicon vacancies. However, the relative immobility of the vacancies makes their outdiffusion more difficult.

Figure 1:
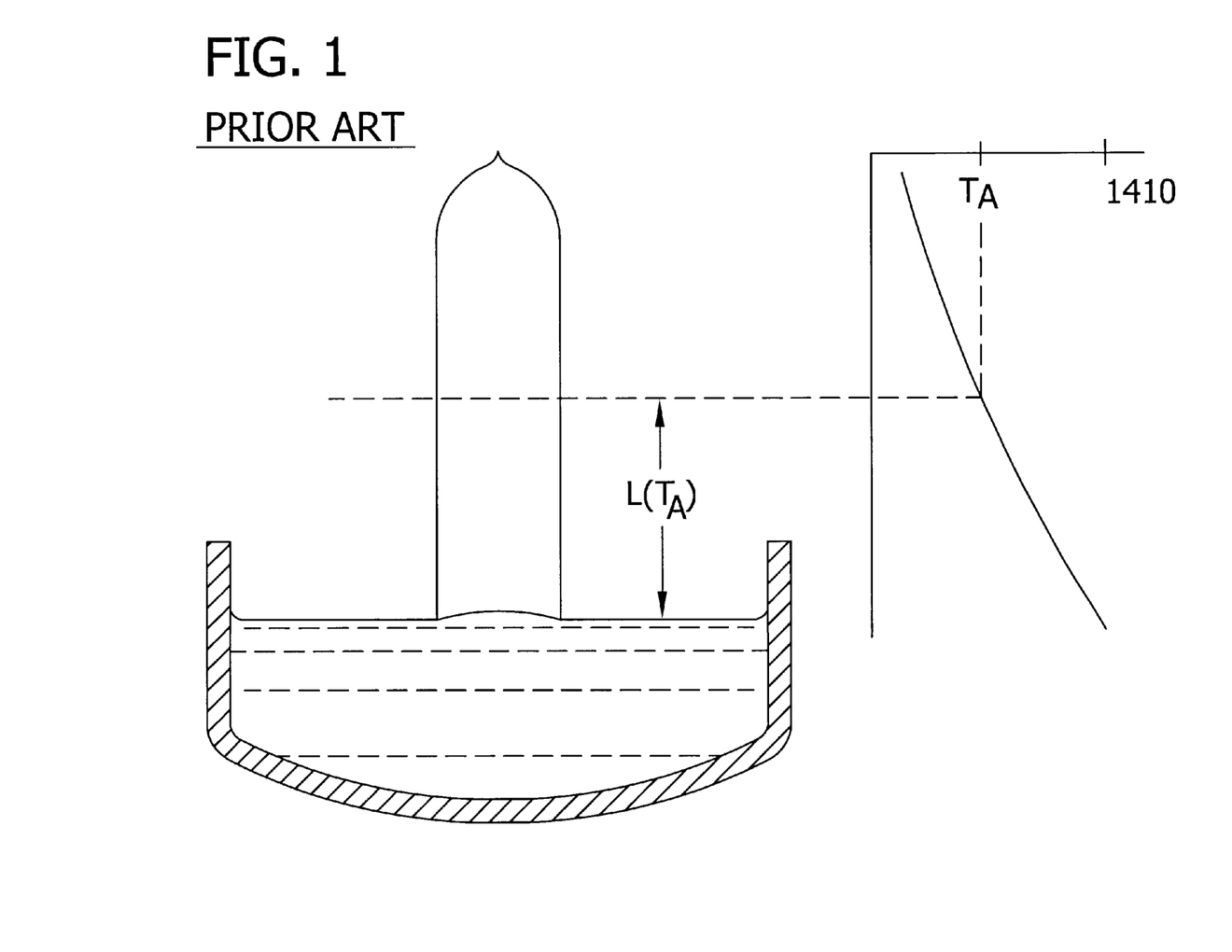
FIG. 1 is a schematic view illustrating existing single crystal silicon ingot growth showing the passage of the ingot during growth through an isotherm at which agglomeration reactions occur.

It would be possible to produce single crystal ingots free of agglomerated micro-defects in presently existing crystal pullers, but there are a number of contradictory conditions present in the operation of the crystal puller and the ingot. Difficult compromises must be made, which materially impact the commercial practicality of the production of defect-free single crystal ingots. Growth of a single crystal silicon ingot is schematically illustrated in FIG. 1. Silicon solidifies from the melt into the ingot at a temperature of about 1410° C. and is thereafter continuously cooled. At some location along the length of the ingot $L(T_A)$ above the melt surface the ingot will pass through an isotherm $T_A$ at which agglomeration reactions occur (e.g., 1050° C.). The ingot will pass through this point during the time it is being grown.

Essentially, growing defect-free ingots would require that temperature distribution in the hot zone be engineered to produce sufficiently long residence times of the ingot at temperatures in excess of a temperature $T_A$ (e.g., about 1050° C.) at which agglomeration reactions occur to permit the out-diffusion of the intrinsic point defects. Maximizing the residence time of axial segment of the ingot above $T_A$ requires that the pull rate be slowed. However, slowing the pull rate drastically reduces throughput for the crystal puller.

The required residence time of each axial segment of the ingot at temperatures in excess of $T_A$ can be reduced somewhat by growing the crystal so that self-interstitial intrinsic point defects predominate. Self-interstitial defects are substantially more mobile than vacancy defects. It is still necessary to minimize the initial concentration of defects. However, to minimize the number of defects, the pull rate should be maximized within the interstitial growth conditions.

In order to produce a single crystal ingot which was substantially free of agglomerated micro-defects over its entire length, each axial segment along the full usable length of the ingot must pass through $T_A$ only after residing at temperature in excess of $T_A$ for a time necessary to out-diffuse the intrinsic point defects. Thus, the same relatively slow pull rate must be maintained even while the unusable end-cone of the ingot is being formed. Furthermore, the ingot must be raised at the same slow rate even after it is formed so that the lower end of the usable constant diameter portion of the ingot has sufficient residence time at temperatures above $T_A$.

The tension between pull rate and residence time necessary for out-diffusion of intrinsic point defects becomes more acute as the diameter of the crystal grown increases. As the diameter of the ingot increases, the number of defects increases and the radial distance through which the defects must diffuse to the surface of the ingot increases.

Still further, minimization of the time for out-diffusion of self-interstitials makes it desirable to minimize the radial variation in initial interstitial concentration. This is achieved by minimizing the radial variation of the axial temperature gradient $G_O(r)$. In order to minimize the radial variation in the axial temperature gradient, it is desirable to minimize the average value of the axial temperature gradient $G_O$ at the ingot at the surface of the silicon melt. However in order to maximize the pull rate which will achieve interstitial growth conditions, it is desirable to minimize the average value of $G_O$.

As a practical matter, very stringent process controls must be maintained in the operation of the crystal puller to produce single crystal silicon ingots which are substantially free of agglomerated intrinsic point defects. Moreover, there is a dramatic reduction in throughput for the crystal puller. Thus, there is presently a need for a process to grow single crystal ingots free of agglomerated intrinsic point defects which decouples or substantially decouples the operation of the crystal puller from the conditions necessary to out-diffuse intrinsic point defects.

SUMMARY OF THE INVENTION

Among the several objects and features of the present invention may be noted the provision of a process of producing a single crystal silicon ingot which is substantially free of agglomerated intrinsic point defects over the entire usable length of the ingot; the provision of such a process which does not substantially diminish the throughput of the crystal puller; the provision of such a process which substantially decouples the operating conditions of the crystal puller from the conditions for production of the defect-free ingot; the provision of such a process which substantially reduces the crystal puller from limitations on pull rate for production of the defect-free ingot; and the provision of such a process which substantially reduces the crystal puller from limitations on the average axial temperature gradient $G_O$.

Briefly, therefore, the present invention is directed to a process for producing a single crystal silicon ingot having a seed-cone, an end-cone and a constant diameter portion between the seed-cone and endcone. The ingot is grown from a silicon melt in accordance with the Czochralski method. Generally, the process comprises growing the ingot from the silicon melt and controlling the temperature of the ingot such that no portion of the ingot cools to a temperature less than a temperature $T_A$ at which agglomeration of intrinsic point defects in the ingot occurs during the time the ingot is being grown such that at least the constant diameter portion of the ingot is substantially free of agglomerated intrinsic point defects.

The present invention is further directed to a process for producing a single crystal silicon ingot having a seed-cone, an end-cone and a constant diameter portion between the seed-cone and end-cone. The ingot is grown in a crystal puller from a silicon melt in accordance with the Czochralski method. The crystal puller includes a lower growth chamber and an upper pulling chamber, and the process comprises lowering a seed crystal into contact with the silicon melt located in the growth chamber of the crystal puller and withdrawing the seed crystal from the melt so as to cause silicon from the melt to freeze for forming the single crystal silicon ingot. The fully formed ingot is pulled into the pulling chamber, the pulling chamber is then isolated from the growth chamber while the temperature in the pulling chamber is maintained above a temperature $T_A$ at which agglomeration of intrinsic point defects in the ingot occurs.

Other objects and features of the present invention will be in part apparent and in part pointed out hereinafter.

BRIEF DESCRIPTION OF THE DRAWINGS

Corresponding reference characters indicate corresponding parts throughout the several views of the drawings.

DETAILED DESCRIPTION OF THE PREFERRED EMBODIMENTS

Figure 3:
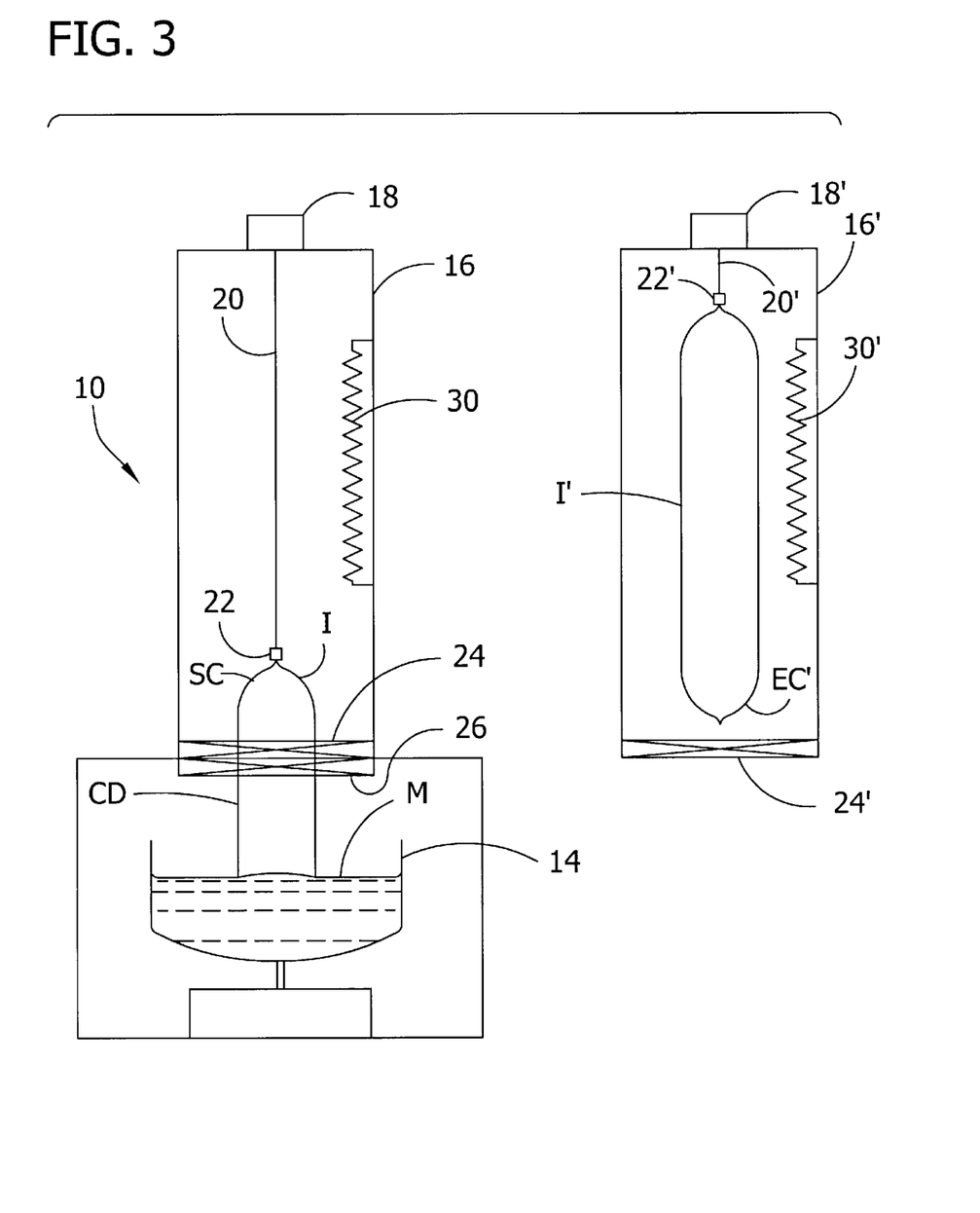
FIG. 3 is a schematic view of a crystal puller apparatus which permits removal of a pulling chamber portion of the crystal puller and replacement with another pulling chamber.

Referring now to the drawings, and in particular to FIG. 3, apparatus for carrying out a process according to the present invention is schematically shown to include a crystal puller indicated generally at 10. The crystal puller includes a growth chamber 12 which houses a crucible 14 for containing a silicon melt M. The crucible 14 is mounted for rotation within the growth chamber 12 in the conventional manner. The crystal puller 10 also includes a conventional heater and insulation (not shown) for heating the silicon in the crucible 14 to produce and maintain its molten state. The crystal puller 10 further comprises a pull chamber 16 located on top of the growth chamber 12 and capable of opening into the growth chamber for receiving a single crystal silicon ingot I being grown from the molten silicon M. The pull chamber 16 has a winch mechanism 18 for raising and lowering a pull wire 20 having a seed crystal chuck 22 at its end. Alternatively, a pulling mechanism (not shown) which employs a shaft rather than a pull wire may be used. The chuck 22 carries a seed crystal (not shown) which is used to initiate formation of the ingot I, according to the Czochralski method.

The pull chamber 16 is equipped with a valve 24 for closing off the pull chamber from the growth chamber 12. Similarly, the growth chamber 12 has its own valve 26 for closing itself off from the pull chamber 16. The pull chamber is releasably mounted on the growth chamber 12 so that the entire pull chamber 16 can be removed from the growth chamber. The apparatus further includes another pull chamber 161 (corresponding parts of the other pull chamber 16' will be designated by the same reference numerals as the pull chamber 16 with the addition of ' after the numeral). The other pull chamber 16' can be mounted on the growth chamber 12 and used to grow another ingot I'. However as illustrated in FIG. 3, one ingot I is being grown in the pull chamber 16 while the other ingot I' is held in the other pull chamber 16' at a location spaced away from the growth chamber 12.

A process carried out according to the principles of the present invention will now be described with reference to the apparatus shown in FIG. 3. As will be understood, the process may be carried out by other apparatus (some examples of which are described hereinafter). The crystal puller 10 is initially prepared in a conventional way, such as by placing solid polysilicon in the crucible 14 and energizing the heater to melt the silicon forming the silicon melt M. The winch mechanism 18 is activated to let out the pull wire 20 and lower the chuck 22 so that the seed crystal contacts the surface of the melt. The crucible 14 and the pull wire 20 are both rotated about a vertical axis. As the seed crystal begins to melt, the winch mechanism 18 is activated to slowly reel in the pull wire 20, raising the seed crystal from the melt. Silicon from the melt M freezes onto the seed crystal in a monocrystalline lattice, thereby beginning to form the ingot I.

The ingot initially has a seed cone SC, which has a diameter which increases to the point where it equals the diameter of the ingot which is desired to be grown (typically somewhat greater than the desired diameter of semiconductor wafers ultimately formed from the ingot). A constant diameter portion CD is grown by controlling the pull rate and heating of the ingot I. An end cone EC' (shown only on the other ingot I') is formed in order to separate the ingot I from the melt M when the constant diameter CD portion has reached the length needed. This length is limited by the geometry of the crystal puller 10. The end cone EC' is also formed by controlling (i.e., generally increasing) the pull rate of the ingot and by the application of heat. After separation from the melt M, the ingot I is pulled entirely within the pull chamber 16.

According to the process of the present invention, the temperature of the ingot I is maintained above the temperature $T_A$ at which intrinsic point defects will become supersaturated and agglomerate during the growth of the ingot. More specifically, no portion of the ingot I is allowed to cool to the temperature $T_A$ during the time the crystal is being grown. Thus unlike the conventional Czochralski process example illustrated in FIG. 1, the ingot I never passes through the isotherm $T_A$ while it is being grown. The restrictions on the production of single crystal silicon previously caused by the presence of the isotherm at $T_A$ are removed by the process of the present invention. It is envisioned that control of the cooling of the ingot I may be achieved by thermal shielding, the application of heat or some combination of the two. In the illustrated embodiment, the pull chamber 16 is provided with a heater 30 (schematically shown in FIG. 3) for applying heat to the ingot I as it nears and enters the pull chamber.

The ingot I is held at temperatures above $T_A$ for a period of time selected to permit out-diffusion of intrinsic point defects to a concentration within the ingot below a solubility limit necessary for agglomeration of intrinsic point defects to occur. The times (discussed more fully below) necessary for out-diffusion of intrinsic point defects are generally significantly longer than the normal cycle time of the crystal puller 10. To that end, the process of the present invention further comprises removing the ingot I from the location of the crystal puller 10 within a semiconductor production facility to permit the crystal puller to be recycled independently of the thermal condition of the ingot. The ingot I is maintained at temperatures above $T_A$ during and after the time it is removed from the crystal puller 10.

In the embodiment shown in FIG. 3, removal of the ingot I from the crystal puller 10 includes pulling the grown crystal entirely within the pull chamber 16. The valve 24 on the pull chamber 16 and the valve 26 on the growth chamber 12 are closed, isolating the chambers from each other and from the surrounding environment. The pull chamber 16 is then detached from the growth chamber 12 and moved away, as illustrated by the position of the other pull chamber 16' in FIG. 3. The pull chamber 16 holds the ingot I at the temperature above $T_A$ until such time as sufficient out-diffusion of intrinsic point defects has occurred. The ingot I can then be cooled to ambient and removed from the pull chamber 16 for further processing into semiconductor wafers.

The heater in the growth chamber 12 can be deactivated so that the growth chamber may cool to ambient. The growth chamber 12 is then opened up so that the crucible 14 can be removed and replaced with another crystal. Solid polysilicon held in the crucible 14 is melted to form a new melt. At the appropriate time after removal of the pull chamber 16, the other pull chamber 16' (first having had the ingot I' held therein removed) is moved into place on the growth chamber 12. The pull chamber 16' is attached to the growth chamber 12 and the valves 24', 26 of the pull chamber and growth chamber are opened to permit another single crystal silicon ingot I' to be grown.

Figure 2:
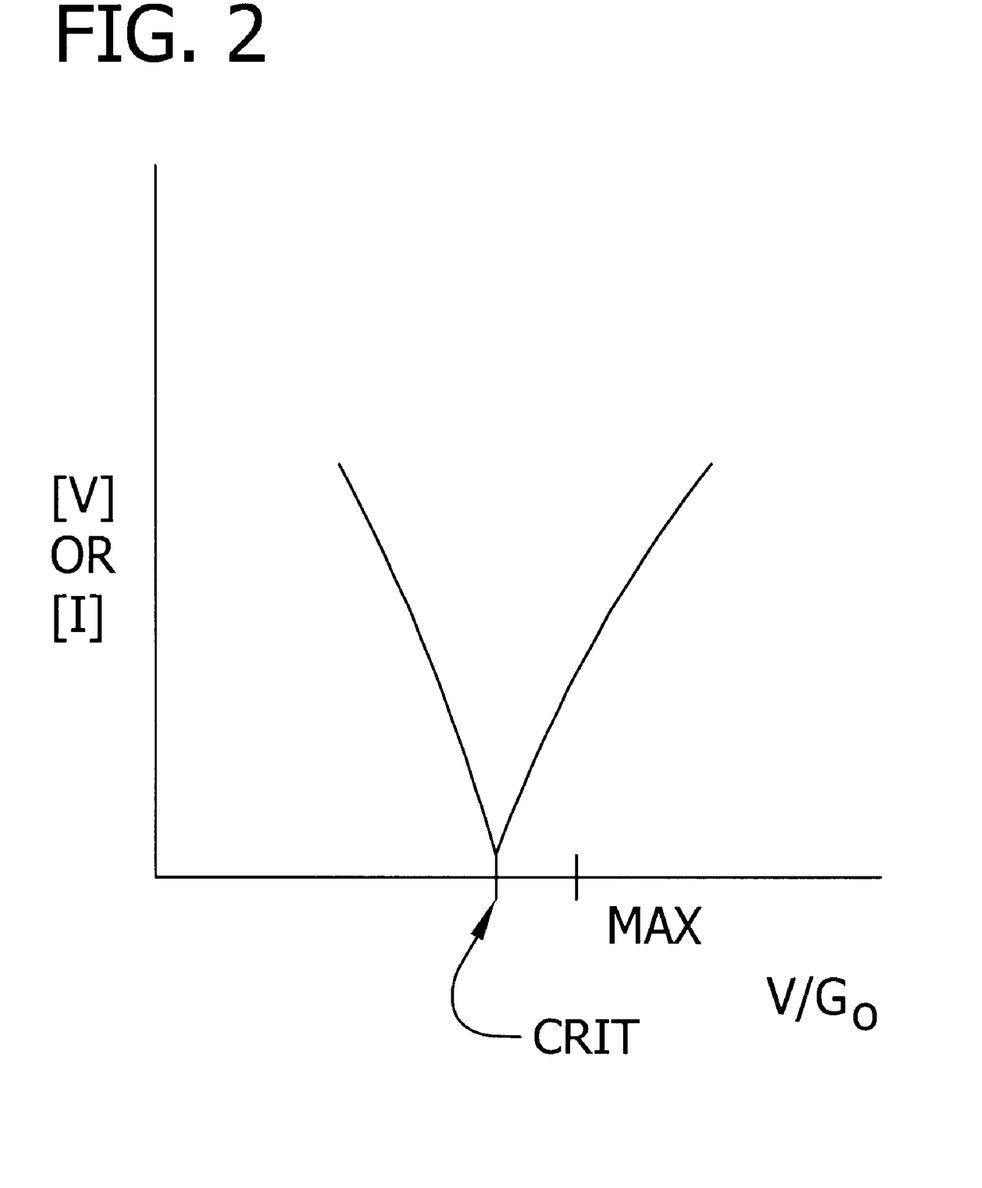
FIG. 2 is a graph which shows an example of how the initial concentration of self-interstitials [I] and vacancies [V] changes with the value of $v/G_O$, where v is the pull rate and $G_O$ is the average axial temperature gradient.

The total time necessary to hold the ingot I above $T_A$ depends upon the initial concentration of intrinsic point defects, the type of intrinsic point defects which predominate in the ingot and the diameter of the ingot being grown. Referring now to FIG. 2, the concentration of both types of intrinsic point defects is plotted against the ratio of the pull rate v over the average instantaneous axial temperature gradient $G_o$ in the ingot I at the surface of the melt. At lower ratios of $v/G_o$, self-interstitial intrinsic point defects [I] predominate, and at higher ratios vacancy defects [V] predominate. However, it may be seen that at a critical ratio of $v/G_o$ concentrations of both types of intrinsic point defects are minimized. Presently, it is believed that this ratio is about $2.1 \times 10^{-5}$ cm$^2$/sK. It is desirable to maintain the ratio $v/G_o$ near the critical value, but this is difficult to do over the course of the entire growth process of the ingot I, particularly at the seed-cone and end-cone ends. A feature of the present invention that the growth of the ingot I is somewhat less dependent upon the $v/G_o$ ratio because of the out-diffusion of intrinsic point defects permitted by the present invention without significantly affecting the cycle time of the crystal puller 10.

Preferably, the self-interstitial type of intrinsic point defect will predominate in the ingot I grown according to the process of the present invention. Self-interstitial defects [I] are substantially more mobile than vacancy defects [V]. Radial out-diffusion of self-interstitials can occur about 10 times faster than outdiffusion of vacancies. Stated another way, it takes ten times as long to out-diffuse vacancies in a vacancy dominated ingot as to out-diffuse interstitials of the same concentration in an interstitial dominated ingot. As a result, it is preferred that the ratio $v/G_o$ be maintained below the critical value over substantial portions of the growth of the ingot I so that self-interstitial varies across the radius of the ingot I so that there will be a radial variation of concentration and type of defect within the ingot. However, movement into the vacancy dominated region of $v/G_o$ for portions of the ingot I is permitted so long as self-interstitial defects predominate sufficiently to recombine with the vacancies during out-diffusion, thereby annihilating both defects so that their concentration remains below the solubility limit.

It is to be understood, however, that the process of the present invention may be used for vacancy dominated material. As a general rule, vacancy dominated material (if present at all) will be present at the axial center of the ingot and, depending upon crystal growth conditions, may extend from the center to the edge of the ingot. In those instances in which vacancy dominated material does not extend from center to edge, a core of vacancy dominated material will be surrounded by an annular ring of interstitial dominated material. Due to the slower mobility of vacancies in the silicon lattice (as compared to silicon self-interstitial atoms), the times involved to achieve the necessary relaxation of the vacancy system (i.e., suppression of the vacancy concentration) by out-diffusion of vacancies to the surface can be relatively long. In one embodiment of the present invention, therefore, the time required to suppress the concentration of vacancies is reduced by injecting silicon self-interstitial atoms into the ingot which diffuse to and recombine with the pre-existing vacancies and annihilate them. In this embodiment, silicon self-interstitial atoms may be injected by oxidizing the surface of the ingot as it is being held at a temperature in excess of the temperature at which agglomeration reactions occur. Oxidation may be achieved, for example, by exposing the ingot to an oxidizing atmosphere (e.g., an atmosphere comprising oxygen or steam, preferably substantially, if not entirely, oxygen or steam) during the holding period. The oxide layer may be grown to a thickness on the order of several microns (e.g., 3, 4, 5) or even 10 or more microns. Because the thickness of the oxide layer affects the rate of oxidation (which, in turn, affects the rate at which silicon self-interstitial atoms are injected), it may be advantageous in one, two or more cycles to strip the grown oxide layer (for example, with hydrogen or HF vapor), and then reoxidize the crystal surface during the holding period.

The diameter of the ingot I being grown affects the time needed for diffusion of intrinsic point defects, simply because the intrinsic point defects must traverse greater radial distances as the diameter of the ingot increases. The necessary time for diffusion scales with the square of the radius of the ingot I. Thus, it has been found that where the constant diameter portion of the ingot is about 150 mm, the total time at which the ingot resides above $T_A$ (i.e., about 1050° C., 1000° C., or even 900° C.) is at least about 10 hours, preferably at least about 12 hours, and more preferably at least about 15 hours. The total time at which a 200 mm ingot resides in a similar system at a temperature above $T_A$ would thus be at least about 22 hours, preferably at least about 25 hours, and more preferably at least about 30 hours, while the total time at which a 300 mm ingot resides in a similar system at a temperature above $T_A$ would thus be at least about 48 hours, preferably at least about 60 hours, and more preferably at lest about 75 hours. It is to be understood that the precise times for out-diffusion can be other than described without departing from the scope of the present invention.

Figure 4:
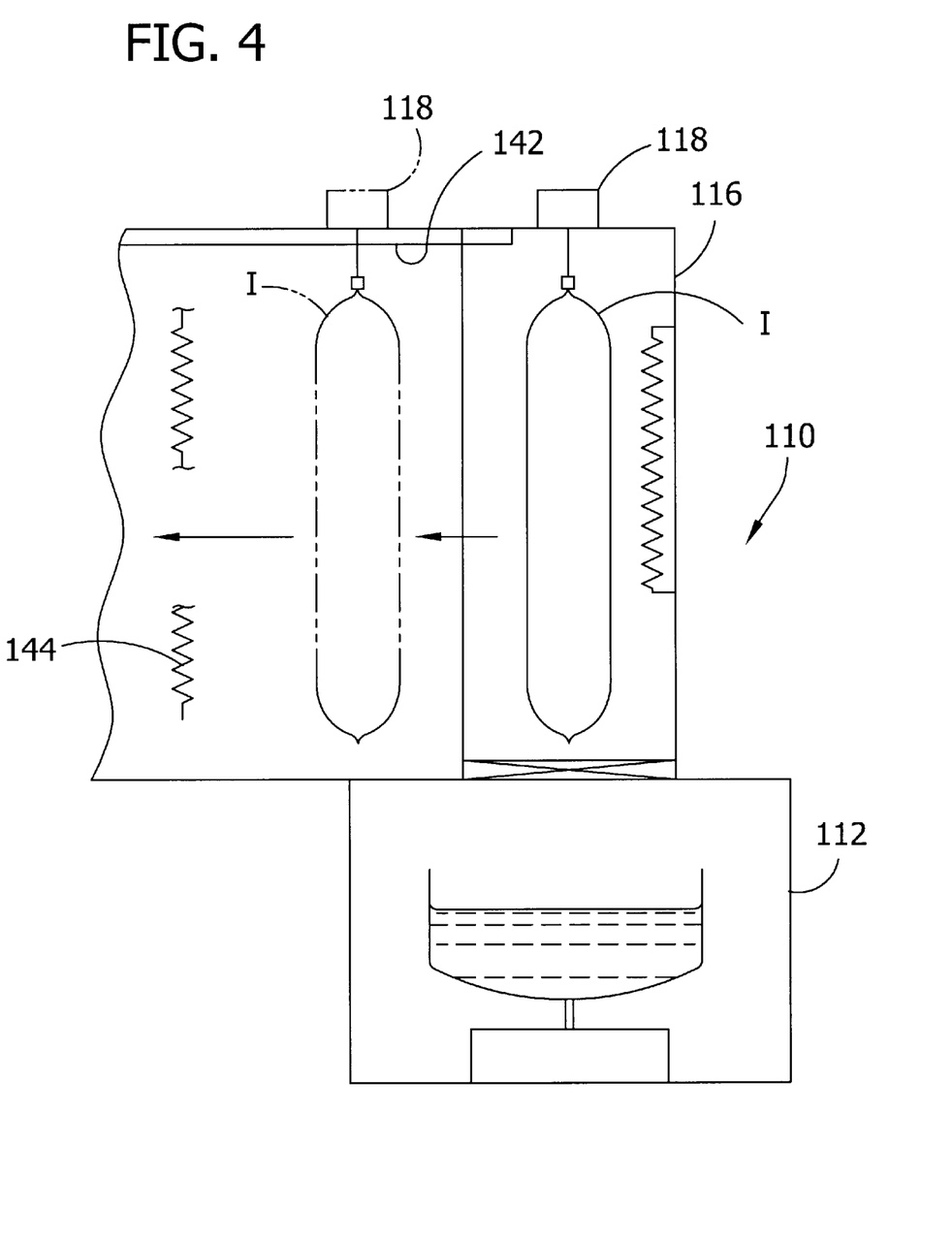
FIG. 4 is a schematic view of a crystal puller apparatus which permits the ingot to be removed from the pulling chamber to a holding chamber located to the side of the pulling chamber.

Referring now to FIG. 4, a process of a second embodiment is illustrated. The process is the same as the process of the first embodiment, except that a pull chamber 116 of the crystal puller 110 is not removed from a growth chamber 112. In the second embodiment, the pull chamber 116 has been modified to open into a holding chamber 140 next to the pull chamber. For purposes of the present description of the process, the holding chamber 140 does not form part of the crystal puller 110 even though it is physically attached to the crystal puller. After the ingot I is fully grown and drawn up into the pull chamber 116, a door (not shown) separating the pull chamber from the holding chamber 140 is opened and the ingot is moved into the holding chamber where it is held at temperatures above $T_A$ for the appropriate time. A track 142 is shown for carrying the ingot I into the holding chamber 140. In the illustrated embodiment, the holding chamber 140 has a heater 144. Thereafter, the ingot I is moved into a thermal lock (not shown) to permit cooling and removal of the ingot from the holding chamber 140 without compromising the thermal environment of the holding chamber. In the meantime, the door separating the pull chamber 116 from the holding chamber 140 can be closed. Another winch mechanism and pull wire (not shown) are moved into place in the pull chamber 116 for growing another single crystal ingot (not shown).

Figure 5:
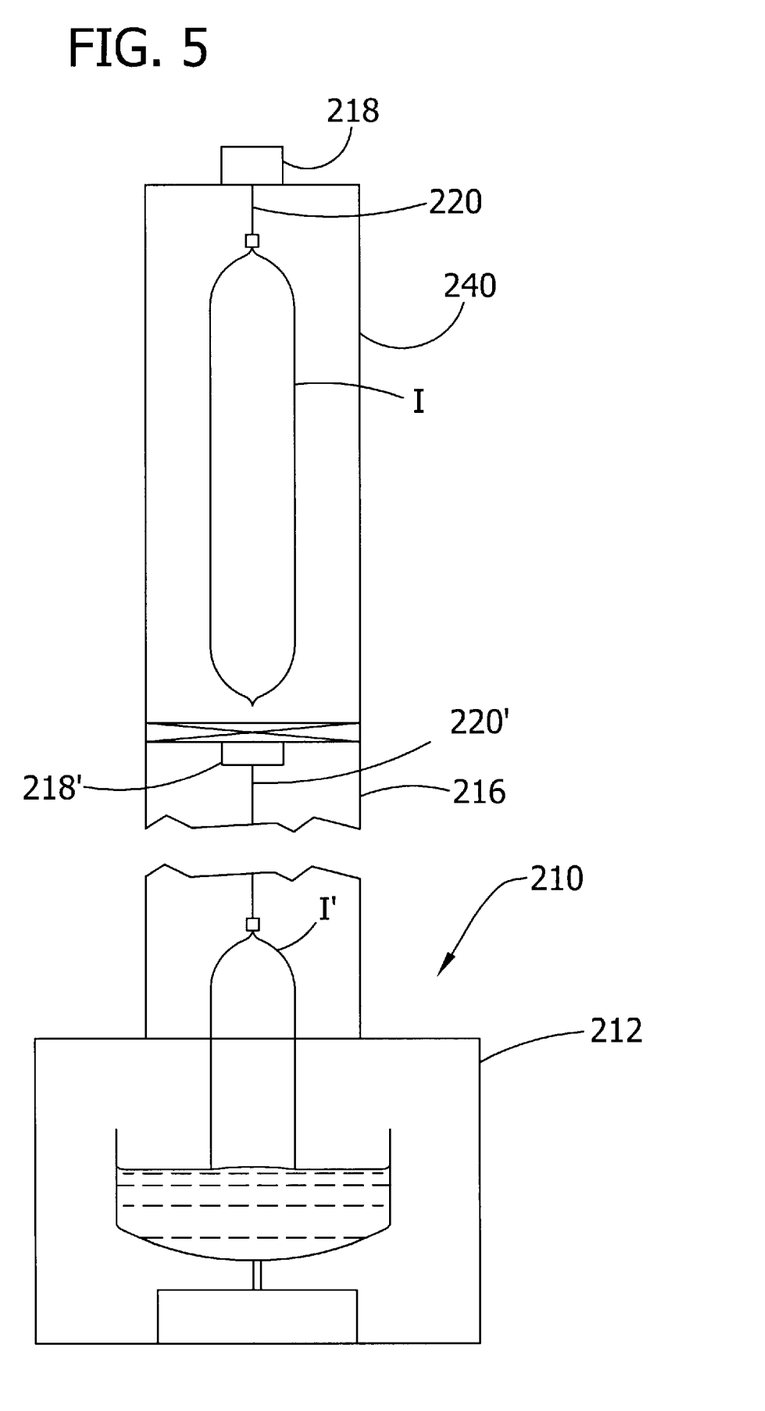
FIG. 5 is a schematic view of a crystal puller apparatus which permits the ingot to be removed from the pulling chamber to a holding chamber located generally above the pulling chamber.

A third embodiment of the process of the present invention is shown in FIG. 5. The process is closely similar to that illustrated in FIG. 4 because the pull chamber 216 is not moved, but rather the ingot I is moved to a holding chamber 240. The primary difference is that holding chamber 240 is located above rather than to the side of the pull chamber 216. Again, a separate winch mechanism 218' and pull wire 220' would be moved into place so that growth of another ingot I' in the crystal puller 10 can take place without regard to the thermal condition of the ingot I already grown.

It is to be further noted that, for each of the above-described embodiments of the present process wherein the grown ingot is held within the pull chamber to provide sufficient time for out-diffusion, it is preferred that the pull chamber have a non-uniform thermal profile. Stated another way, because at least a portion of the grown ingot has cooled below temperature at which agglomerated intrinsic point defects form ($T_A$), it is not necessary that this portion be maintained at a temperature in excess of $T_A$ upon being removed or separated from the growth chamber. In fact, it is preferred that the temperature profile for this portion of the crystal not exceed $T_A$ because if the temperature is too high (i.e., more than about 1175° C., 1200° C. or more), the concentration of intrinsic point defects could again be raised above the solubility limit, or critical concentration, as a result of diffusion. However, while the temperature of this region must not be too high, the temperature of the remaining portion of the ingot must be maintained sufficiently high such that agglomerations do not occur.

If a non-uniform thermal profile is employed, preferably the temperature will gradually increase from the seed end to the tail end, typically ranging from about 1000° C. to about 1200° C. and preferably ranging from about 1050° C. to about 1175° C. The axial locations within the ingot having temperatures in excess of $T_A$ will then be cooled in accordance with the present invention, preferably until the temperature profile becomes uniform. The ingot may then be further cooled, as is common in the art, and removed for additional processing.

While a non-uniform temperature profile is preferred, it is to be noted that a uniform temperature profile may also be employed. However, if a uniform profile is to be used, the temperature must be sufficiently above $T_A$ to prevent agglomeration from occurring, but not so high that regions which have previously been cooled below $T_A$ are again capable of becoming critical supersaturated (as discussed above). Accordingly, therefore, the temperature will preferably range from about 1125° C. to about 1200° C., and more preferably from about 1150° C., to about 1175° C. Once the ingot is inside the chamber, the temperature of this uniform profile will then be reduced in accordance with the present invention to cool the ingot below $T_A$. The ingot may then be further cooled, as is common in the art, and removed for additional processing.

The following Example illustrates the invention.

EXAMPLE

Two 200 mm crystal ingots were grown in a crystal puller capable of producing fully agglomerated intrinsic defect-free material when the ingots are grown at the rate depicted by the dashed line in FIG. 6A (hereinafter, the "defect-free" growth rate curve). The two crystals were grown at the same target growth rate, depicted in FIG. 6A as a continuous line, with the growth rate being reported as a normalized growth rate (i.e., the actual growth rate relative to the critical growth rate, typically expressed as a ratio of the actual growth velocity over the critical growth velocity). As depicted, the ingots were initially grown for a period of time at a rate which was in excess of the "defect-free" growth rate curve, then for a period of time at a rate which was less than the "defect-free" growth rate curve, and then again for a period of time at a rate in excess of the "defect-free" growth rate curve. The first ingot (87GEX) was allowed to cool naturally in the crystal growth chamber upon completion of the growth of the ingot. The second ingot (87GEW), however, was not allowed to cool naturally in the crystal growth chamber; instead, upon completion of the growth of the ingot, the heaters in the hot zone of the crystal puller remained on and the ingot was held for 30 hours in the pull chamber; the temperature profile was such that regions of the ingot more than about 400 mm from the seed end were held at a temperature in excess of about 1,050° C. and regions less than about 400 mm from the seed end were held at a temperature less than about 1,050° C. during this period.

The ingots were sliced longitudinally along the central axis running parallel to the direction of growth, and then further divided into sections, each about 2 mm in thickness. Using a copper decoration technique, the sets of longitudinal sections which make-up each ingot from seed to tail were intentionally contaminated with copper and heated, the heating conditions being appropriate to dissolve a high concentration of copper into the sections. Following this heat treatment, the samples were rapidly cooled, during which time the copper either outdiffused or precipitated at sites where oxide clusters or agglomerated interstitial defects were present. After a standard defect delineating etch, the samples were visually inspected for the presence of precipitated impurities; those regions which were free of such precipitated impurities corresponded to regions which were free of agglomerated interstitial defects. Photographs were then taken of the sections of each crystal and the photographs assembled to show the results for each crystal from seed to tail end. The set of photographs for the first, naturally-cooled ingot (87GEX) are depicted in FIG. 6B and the set of photographs for the second, held ingot (87GEW) are depicted in FIG. 6C.

Figure 6A:
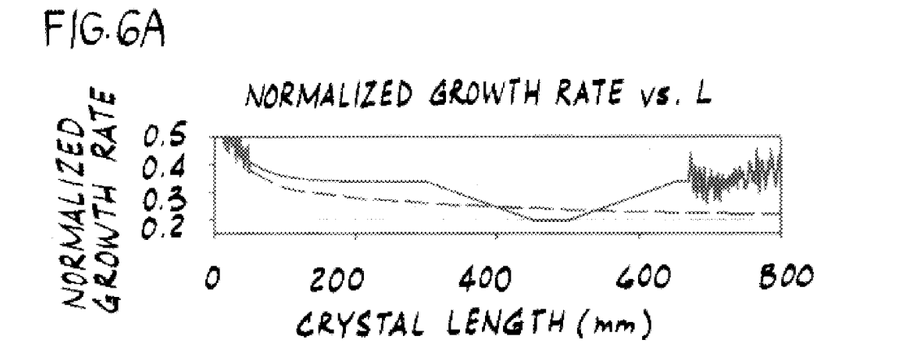
FIG. 6A is a graph of the normalized growth rate as a function of crystal length, as described in the Example.
Figure 6B:
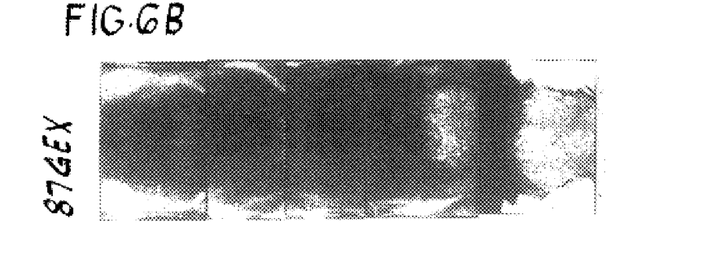
FIG. 6B is a series of photographs of axial cuts of segments of an ingot, ranging from the shoulder to where end-cone growth begins, following copper decoration and a defect-delineating etch, as described in the Example; and, FIG. 6C is a series of photographs of axial cuts of segments of an ingot, ranging from the seed-cone to the end-cone, following copper decoration and a defect-delineating etch, as described in the Example.
Figure 6C:
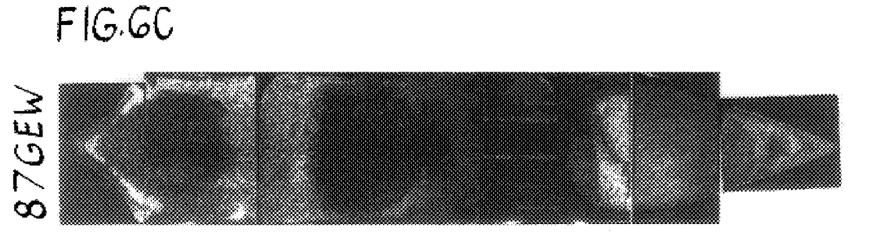

Referring now to FIGS. 6A, 6B, and 6C, it can be seen that the naturally-cooled ingot (87GEX) contains agglomerated vacancy defects from 0 to about 393 mm, no agglomerated intrinsic point defects from about 393 mm to about 435 mm, agglomerated intrinsic point defects from about 435 mm to about 513 mm, no agglomerated intrinsic point defects from about 513 mm to about 557 mm, and agglomerated vacancy defects from 557 mm to the end of the crystal. These correspond to the regions above, within and below the defect-free growth conditions for this hot zone. The held ingot (87GEW) contains agglomerated vacancy defects from 0 to about 395 mm, no agglomerated intrinsic point defects from about 395 mm to about 584 mm, and agglomerated vacancy defects from about 584 mm to the end of the crystal. The most significant difference between the two ingots, therefore, occurs in the region from about 435 mm to about 513 mm in which the naturally-cooled ingot (87GEX) contains agglomerated intrinsic point defects whereas the held ingot (87GEW) does not. During the holding period, the concentration of self-interstitial silicon atoms in the held ingot (87GEW) is suppressed by additional diffusion of the self-interstitial atoms to the surface of the ingot and vacancy dominated regions and thus, critical supersaturation and the agglomeration reaction for interstitial atoms is avoided subsequent to crystal solidification. In the naturally cooled ingot, however, insufficient time is allowed for additional diffusion to the surface and vacancy dominated regions and, as a result, the system becomes critically supersaturated in silicon self-interstitial atoms and an agglomeration reaction occurs.

These ingots thus illustrate that given sufficient amounts of time and sufficiently high temperatures, virtually any amount of silicon self-interstitial atoms can be outdiffused to the surface.

In addition, the "defect-free" growth rate curve depicted in FIG. 6A falls within a range of crystal growth rates which provide fully agglomerated intrinsic defect-free material under natural cooling conditions for this crystal puller configuration. Even under natural cooling conditions for this hot zone configuration, there is a range of crystal growth rates between the growth rate ($P_v$) at which agglomerated vacancy defects form and the growth rate ($P_I$) at which agglomerated intrinsic point defects form; this range is at least ±5% of the average of $P_v$ and $P_I$. When the residence time of the grown crystal at temperatures in excess of about 1,050° C. is increased, this range is increased further with the range being, for example, at least ±7.5%, at least ±10%, or even at least ±15% of the average of $P_v$ and $P_I$ (for example, for crystal 87GEW the residence was sufficiently great that, $P_I$, was not achieved and thus, $P_I$ for this crystal was less than the lowest pull rate achieved). These results are presented in Table I, below.

TABLE I

| Transition | position mm | Normalized Pull rate, V | V_ave | Window (DV) | % variation 100 (DV/Vave) |
|---|---|---|---|---|---|
| 87GEX | | | | | |
| V-P | 393 | 0.251 | | | |
| P-I | 435 | 0.213 | 0.232017 | 0.03865546 | 16.66 |
| I-P | 513 | 0.209 | | | |
| P-V | 557 | 0.249 | 0.22937 | 0.0402521 | 17.55 |
| 87GEW | | | | | |
| V-P | 395 | 0.246 | | | |
| P* | 465 | 0.196 | 0.221008 | 0.05042017 | 22.81 |
| P* | 465 | 0.196 | | | |
| P-V | 584 | 0.271 | 0.233193 | 0.07478992 | 32.07 |

*In 87GEW where no P-I transition is observed, we take the minimum V within the window to determine the window size.

The increase in window size (or allowable pull rate variation for defect-free growth) is substantially limited to slower pull rates (i.e., to values smaller than the critical v/G for vacancy to interstitial dominated material (plus some small delta to take into account interstitial annihilation of vacancies)). That is to say that the effect is strongest for interstitial dominated material, silicon self-interstitial atoms being a faster diffusing element than vacancies. In other words, the window opens more quickly toward lower pull rates. In principle, the window for allowable pull rate variation towards faster pull rates (greater than the critical v/G value plus some small delta) into vacancy dominated material) would also open towards faster pull rates (vacancy dominated material) with increased dwell times at temperatures greater than about 1050° C.—as vacancies diffuse toward the crystal surfaces—but this would require significantly longer times.

For a given crystal puller and hot zone configuration, it may be assumed that the axial temperature gradient, $G_0$, is approximately constant over relatively short distances such as occur in the transition ranges which occur here. As a consequence, a change in the crystal growth rate leads to a proportional change in $v/G_0$, and thus, the initial concentration of vacancies and silicon self-interstitial atoms. In general, however, the value of $v/G_0$ at the center ingot is the most critical value since it is the farthest distance from the surface. Thus, the results of this example demonstrate that the increase in pull rate variations achieved through increased dwell times at temperatures greater than about 1000° C. implies that corresponding variations in $v/G_0$ may occur at any point along the radius of the crystal. In other words, radial variation of $v/G_0$ is irrelevant and thus, for example, may exceed (at any radial position) 10%, 15% or more of the value of $v/G_0$ at the center of the ingot.

In view of the above, it will be seen that the several objects of the invention are achieved.

As various changes could be made in the above compositions and processes without departing from the scope of the invention, it is intended that all matter contained in the above description be interpreted as illustrative and not in a limiting sense.

What is claimed is:

1. A process of producing a single crystal silicon ingot having a seed-cone, and end-cone and a constant diameter portion between the seed-cone and end-cone, the ingot being grown from a silicon melt in accordance with the Czochralski method, the process comprising growing the ingot from the silicon melt and controlling the temperature of the ingot such that no portion of the ingot cools to a temperature less than a temperature $T_A$ at which agglomeration of intrinsic point defects in the ingot occurs during the time the ingot is being grown such that at least the constant diameter portion of the ingot is substantially free of agglomerated intrinsic point defects.

2. A process as set forth in claim 1 wherein the ingot is exposed to an oxidizing atmosphere as the ingot is maintained at a temperature in excess of the temperature $T_A$ at which agglomeration of intrinsic point defects in the ingot occurs.

3. A process as set forth in claim 2 wherein the ingot is exposed to at least one cycle as the ingot is maintained at a temperature in excess of the temperature $T_A$ at which agglomeration of intrinsic point defects in the ingot occurs wherein in the first phase of the cycle the ingot is exposed to an oxidizing atmosphere and in the second phase of the cycle the ingot is exposed to an atmosphere which dissolves or otherwise removes silicon dioxide from the surface of the ingot.

4. A process as set forth in claim 1 which is carried out in a crystal puller at a location in a semiconductor production facility, the process further comprising the step of removing the ingot from the location while maintaining the ingot at temperatures above $T_A$ to permit the crystal puller to be cooled and re-started for growth of another single crystal silicon ingot.

5. A process as set forth in claim 4 wherein the crystal puller has a lower growth chamber and an upper pulling chamber, and wherein the step of removing the ingot comprises moving the ingot from the pulling chamber to a holding chamber adjacent to the pulling chamber, the holding chamber being heated to maintain the ingot at temperatures above $T_A$.

6. A process as set forth in claim 4 wherein the crystal puller has a lower growth chamber and an upper pulling chamber, and wherein the step of removing the ingot comprises isolating the pulling chamber from the growth chamber, detaching the pulling chamber from the growth chamber and moving the pulling chamber away from the growth chamber.

7. A process as set forth in claim 6 further comprising moving another pulling chamber into position over the growth chamber and attaching said other pulling chamber to the growth chamber.

8. A process as set forth in claim 1 wherein the ingot is maintained at temperatures above $T_A$ for a period of time selected to permit out diffusion of intrinsic point defects to achieve a concentration below a solubility limit required for agglomeration of intrinsic point defects to occur.

9. A process as set forth in claim 8 wherein the ingot is maintained at temperatures above $T_A$ for a period following the growth of the ingot.

10. A process as set forth in claim 9 wherein $T_A$ is less than the solidification temperature of silicon and greater than about 1050° C.

11. A process as set forth in claim 9 wherein $T_A$ is less than the solidification temperature of silicon and reater than about 900° C.

12. A process as set forth in claim 9 wherein the ingot is grown by controlling a growth velocity, v, and an average axial temperature gradient, $G_0$, so that the ingot has a predominance of self-interstitial intrinsic point defects.

13. A process as set forth in claim 9 wherein the ratio of $V/G_O$ is controlled to be less than about $2.1 \times 10^{-5}$ cm$^2$/s-K.

14. A process as set forth in claim 9 wherein the diameter of the constant diameter portion of the ingot is about 150 mm and the time the ingot is held above the temperature $T_A$ from the onset of growth of the ingot is at least about 12 hours.

15. A process as set forth in claim 9 wherein the diameter of the constant diameter portion of the ingot is about 200 mm and the time the ingot is held above the temperature $T_A$ from the onset of growth of the ingot is at least about 22 hours.

16. A process as set forth in claim 9 wherein the diameter of the constant diameter portion of the ingot is about 300 mm and the time the ingot is held above the temperature $T_A$ from the onset of growth of the ingot is at least about 48 hours.

17. A process of producing a single crystal silicon ingot having a seed-cone, and end-cone and a constant diameter portion between the seed-cone and end-cone, the ingot being grown in a crystal puller from a silicon melt in accordance with the Czochralski method, the crystal puller including a lower growth chamber and an upper pulling chamber, the process comprising:

lowering a seed crystal into contact with the silicon melt located in the growth chamber of the crystal puller;

withdrawing the seed crystal from the melt so as to cause silicon from the melt to freeze for forming the single crystal silicon ingot;

pulling the fully formed ingot into the pulling chamber;

isolating the pulling chamber from the growth chamber;

maintaining the temperature in the pulling chamber above a temperature $T_A$ at which agglomeration of intrinsic point defects in the ingot occurs.

18. A process as set forth in claim 17 wherein the ingot is exposed to an oxidizing atmosphere as the ingot is maintained at a temperature in excess of the temperature $T_A$ at which agglomeration of intrinsic point defects in the ingot occurs.

19. A process as set forth in claim 18 wherein the ingot is exposed to at least one cycle as the ingot is maintained at a temperature in excess of the temperature $T_A$ at which agglomeration of intrinsic point defects in the ingot occurs wherein in the first phase of the cycle the ingot is exposed to an oxidizing atmosphere and in the second phase of the cycle the ingot is exposed to an atmosphere which dissolves or otherwise removes silicon dioxide from the surface of the ingot.

20. A process as set forth in claim 17 wherein the ingot is maintained at temperatures above $T_A$ for a period of time selected to permit out diffusion of intrinsic point defects to achieve a concentration below a solubility limit required for agglomeration of intrinsic point defects to occur.

21. A process as set forth in claim 20 wherein $T_A$ is less than the solidification temperature of silicon and greater than about 1050° C.

22. A process as set forth in claim 20 wherein $T_A$ is less than the solidification temperature of silicon and greater than about 900° C.

23. A process as set forth in claim 20 wherein the ingot is grown by controlling a growth velocity, v, and an average axial temperature gradient, $G_0$, so that the ingot has a predominance of self-interstitial intrinsic point defects.

24. A process as set forth in claim 20 wherein the ratio of $v/G_0$ is controlled to be less than about $2.1 \times 10^{-5}$ cm$^2$/s-K.

25. A process as set forth in claim 20 wherein the diameter of the constant diameter portion of the ingot is about 150 mm and the time the ingot is held above the temperature $T_A$ from the onset of growth of the ingot is at least about 12 hours.

26. A process as set forth in claim 20 wherein the diameter of the constant diameter portion of the ingot is about 200 mm and the time the ingot is held above the temperature $T_A$ from the onset of growth of the ingot is at least about 22 hours.

27. A process as set forth in claim 20 wherein the diameter of the constant diameter portion of the ingot is about 300 mm and the time the ingot is held above the temperature $T_A$ from the onset of growth of the ingot is at least about 48 hours.

28. A process as set forth in claim 17 wherein the crystal puller is disposed at a location in a semiconductor production facility, the process further comprising the step of removing the ingot from the location while maintaining the ingot at temperatures above $T_A$ to permit the crystal puller to be cooled and re-started for growth of another single crystal silicon ingot.

29. A process as set forth in claim 28 wherein the step of removing the ingot comprises moving the ingot from the pulling chamber to a holding chamber adjacent to the pulling chamber, the holding chamber being heated to maintain the ingot at temperatures above $T_A$.

30. A process as set forth in claim 28 wherein the step of removing the ingot comprises detaching the pulling chamber from the growth chamber and moving the pulling chamber away from the growth chamber.

31. A process as set forth in claim 30 further comprising moving another pulling chamber into position over the growth chamber and attaching said other pulling chamber to the growth chamber.

* * * * *

UNITED STATES PATENT AND TRADEMARK OFFICE
CERTIFICATE OF CORRECTION

PATENT NO. : 6,328,795 B2
DATED : December 11, 2001
INVENTOR(S) : Robert J. Falster and Harold W. Korb It is certified that error appears in the above-identified patent and that said Letters Patent is hereby corrected as shown below:

<u>Column 14,</u>
Line 27, "reater" should read -- greater --.
Line 34, "V/G$_0$" should read -- v/G$_0$ --.

Signed and Sealed this

Ninth Day of July, 2002

*Attest:*

*Attesting Officer*

JAMES E. ROGAN
*Director of the United States Patent and Trademark Office*